United States Patent [19]
Tanaka et al.

[11] 4,039,808
[45] Aug. 2, 1977

[54] SOLID STATE IONIZATION CHAMBER OF SILICON PN-JUNCTION TYPE

[75] Inventors: Ryuichi Tanaka, Maebashi; Satoshi Tajima, Takasaki; Akira Usami, Nagoya; Mitsutaka Yokoyama, Fuchu, all of Japan

[73] Assignee: Japan Atomic Energy Research Institute, Tokyo, Japan

[21] Appl. No.: 635,778

[22] Filed: Nov. 26, 1975

[30] Foreign Application Priority Data

Nov. 30, 1974 Japan .................................. 49-137544

[51] Int. Cl.$^2$ ................................................ G01T 1/24
[52] U.S. Cl. ........................................ 250/370; 357/63

[58] Field of Search ................. 250/370, 371; 357/29, 357/63

[56] References Cited

U.S. PATENT DOCUMENTS

| | | | |
|---|---|---|---|
| 3,160,567 | 12/1964 | Steinberg et al. ............... | 250/370 X |
| 3,485,684 | 12/1969 | Mann et al. .......................... | 357/63 X |
| 3,576,996 | 5/1971 | Stevens ........................... | 250/370 X |

*Primary Examiner*—Archie R. Borchelt
*Attorney, Agent, or Firm*—Browdy and Neimark

[57] ABSTRACT

An N/P type silicon solar cell is doped with copper and encased in an aluminum sheath to form a probe. A heavy metal foil means is inserted in the probe to accomplish a solid state ionization chamber of silicon PN-junction type.

11 Claims, 7 Drawing Figures

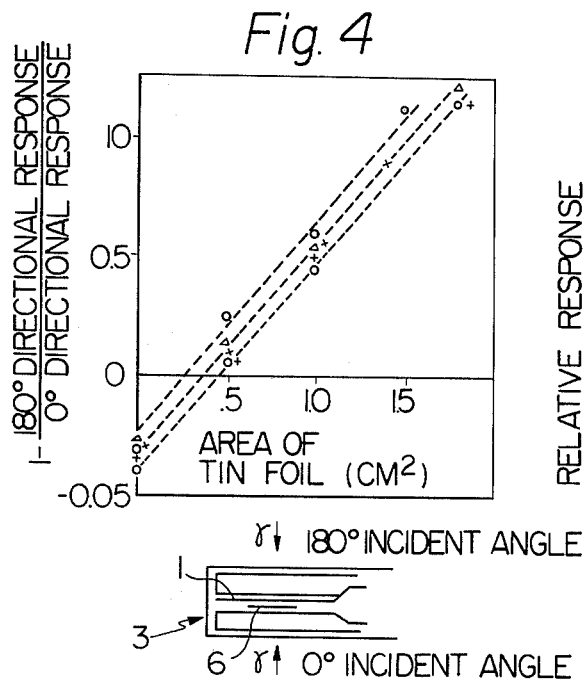
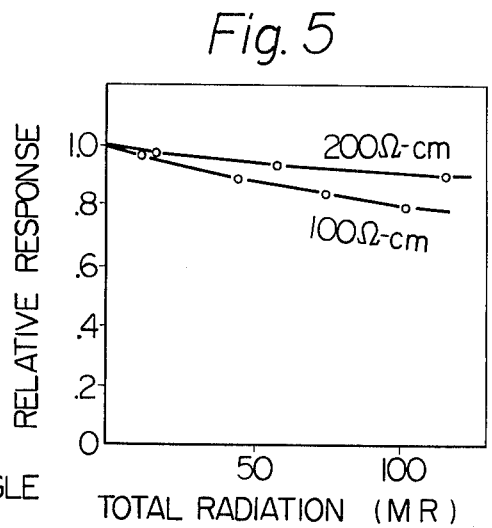
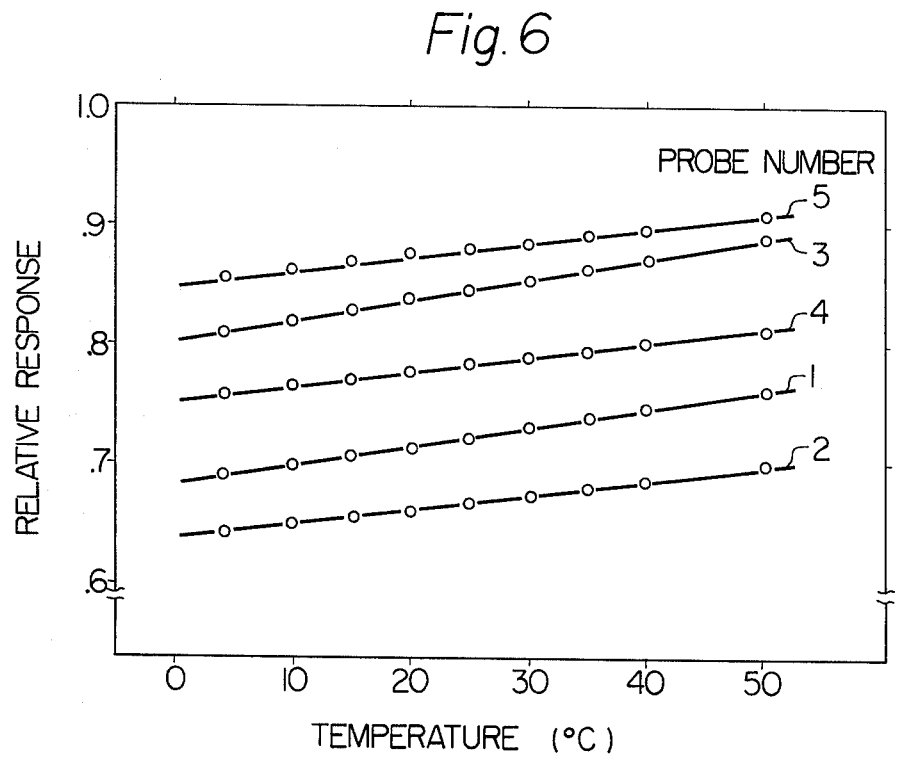

SOLID STATE IONIZATION CHAMBER OF SILICON PN-JUNCTION TYPE

BACKGROUND OF THE INVENTION:

This invention relates to a solid state ionization chamber for measuring gamma-rays and X-rays at high dose rates, which ionization chamber is characterized by being in solid state and by using a silicon solar cell, so that, as compared with conventional gaseous ionization chambers, the ionization chamber of the present invention is less expensive and easier to handle and has a higher radiation resistance.

conventionally, gaseous ionization chambers of various types have been used for the measurement of the dose rates of gamma-rays and X-rays. For the measurement of high dose rates in excess of $10^4$ R/h, the conventional gaseous ionization chambers have the following disadvantages. 1. In order to avoid reduction in the ion-collecting efficiency, the ionizing volume of an ionization chamber for measuring the high dose rates must be small, so that the ionization current per unit does rate becomes small. On the other hand, as the dose rate increases, the influence of the "Stem Effect" and other outside influence from portions other than the sensing portions become prominent. Thus, the measuring error increases.

2. As seen in the case of the "Victoreen type" ionization chamber, the sensitivity of the ionization chamber tends to be changed upon exposure to a large dose. However, there have not been any practical measures available for preventing such sensitivity change from the standpoint of radiation resistance.
3. It is necessary to use a precise D.C. amplifier and to apply a bias potential, so that a D.C. power source is required. Thus, the measurement is complicated, and the measuring device is expensive.
4. The gaseous ionization chamber probe, which is expensive and vulnerable, is not practical for monitoring and routine measurement in the field of high dose rate.

The gaseous ionization chamber is a primary dosimeter, so that it has an advantage of not requiring any dose calibration. However, the gaseous ionization chambers in the market have lost such advantage, because their sensitivity dispersion is large and their sensitivity tends to be charged by radiation damage.

On the other hand, the measurement of dose rate by a silicon solar cell has been used for research purposes on experimental basis. The conventional measurement by a silicon solar cell has the following shortcomings.

1. The sensitivity of silicon solar cells available in the market is greatly degraded upon exposure to gamma-rays, and the response tends to become unstable as the sensitivity degrades. Thus, with such solar cells, reliable measurement is impossible, especially at high dose rates.
2. The directional dependence of a dose rate measurig probe using a solar cell is more than 10%, and it is fairly large.
3. The detection of the output from the solar cells have been carried out by using conventional instruments, such as precise D.C. amplifier and others, but there is no handy means suitable for the large output from solar cells.

Because of the aforesaid shortcomings, the conventional dose rate measurement by solar cells does not provide a simple and practical measuring method of high reliability, as a substitute for the gaseous ionization chamber.

SUMMARY OF THE INVENTION

Therefore, the object of the present invention is to mitigate the aforesaid difficulties of the conventional measuring method using solar cells and the conventional gaseous ionization chambers for high dose rate measurement, by providing a simple and practical measuring device which comprises, in combination, a solar cell with a high radiation resistance, an aluminum probe whose directional dependence is eliminated by heavy metal foils, and IC operational amplifiers.

BRIEF DESCRIPTION OF THE DRAWINGS:

FIG. 4 is a diagram, illustrating the effect of the surface area of a compensating in foil on the directional dependency of sensitivity;

FIG. 5 is a diagram, illustrating the sensitivity degradation of an element caused by Co-60 gamma-ray radiation; and FIG. 6 is a diagram, illustrating the temperature variaton of the sensitivity.

Figure 1:
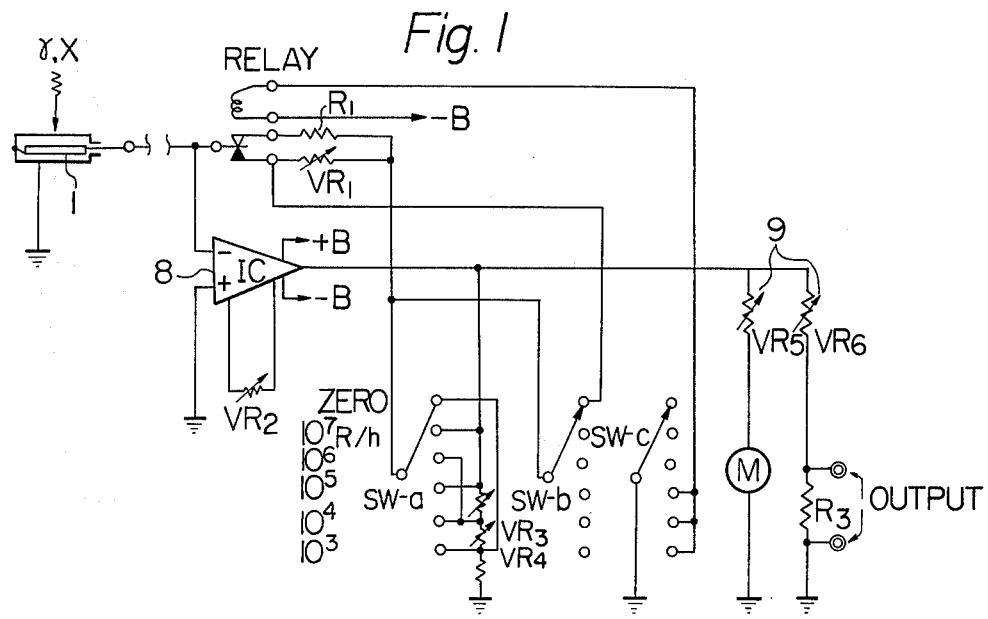
FIG. 1 is a measuring circuit diagram.

DESCRIPTION OF THE PREFERRED EMODIMENTS:

A siliconsolar cell 1 is made by preparing an N/P type element which is made from a material as a base, for instance, a P type bulk with a specific resistance of 100 to 200 ohm-cm, and doping copper therein for improving radiation resistance. In an N/P element without copper (Cu) doping, the impurity boron (B) in the P type bulk is coupled with vacancies generated therein by radiation damage, so as to form B-V complex centers. On the other hand, in an N/P element with copper (Cu) doping, Cu-V complex centers are also formed simultaneously. However, the capture cross section of the Cu-V complex center for the minority carriers (i.e., electrons in this case) is considered to be smaller than that of the B-V complex center. Accordingly, the element doped with copper has a smaller reduction rate of the lifetime of minority carriers in response to gamma-ray radiation, so that the radiation resistance is improved.

The hatched portions 2 of the solar cell 1 are electrodes. The probe is made of a material which establishes secondary electronic equilibrium at the boundary with silicon and has radiation resistance, for instance, aluminum. The inner surface of the probe wall is electrically insulated, for instance, by anodic oxidation. Probe body 10 is of cylindrical shape (FIG. 2A) or flat shape (FIG. 2B), so as to ensure uniform means attenuation rate of intensity in the probe wall, regardless of the incoming direction of gamma-rays. Cap 3 or 3' is used for shielding against light from the outside and for protection. The negative electrode of the solar cell is grounded at a terminal 4, and cnnected to the measuring circuit of FIG. 1, through a 3C2V coaxial cable 5, while using short-circuit current from the positive electrode as a signal source. The foil 6 is used to compensate for the directional dependence. The hole 7 is used for soldering an output wire. The short-circuit current is several hundred times to one thousand times of the ionization current of a conventional gaseous ionization chamber for measuring high dose rates, so that any expensive precise D.C. amplifier is not required. The current is amplified by using a simple and compact IC operational amplifier 8. The output voltage thus amplified can be read by a meter after passing it through a variable resistor 9 for dose calibration, and simultaneously, the output may be easily recorded by a recorder.

The illustrated embodiment is so set to measure the Co-60 gamma-rays at five full scale ranges, i.e., $10^3$ through $10^7$ R/h.

Figure 2A:
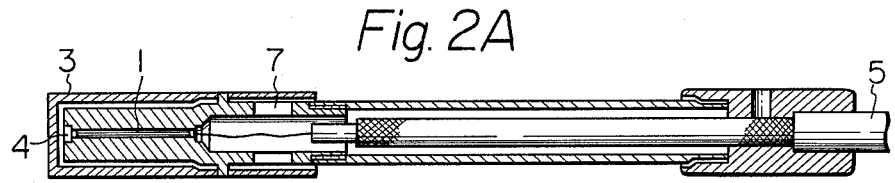
FIGS. 2A and 2B are a sectional view and an assembly view of a cylindrical probe for measuring the exposure rate of gamma-rays and X-rays, respectively.
Figure 2B:
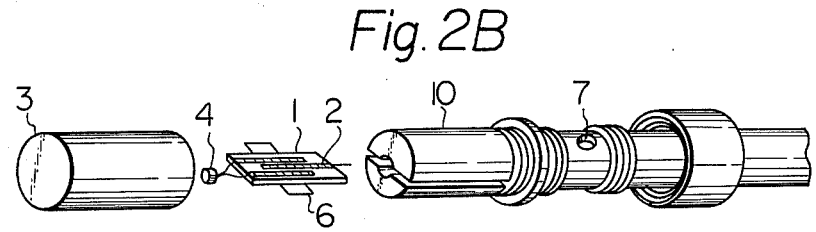
Figure 3:
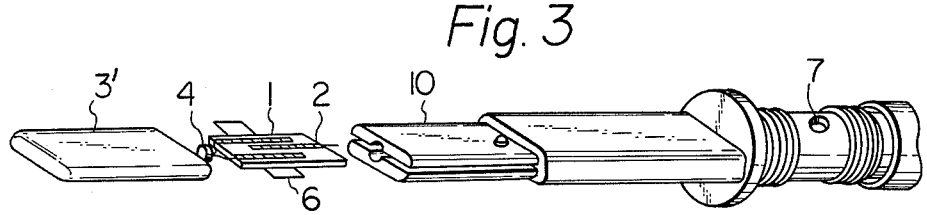
FIG. 3 is an assembly view of a flattened probe for measuring the absorbed dose in an irradiated medium.

An embodiment will now be described, which was made by using a probe of FIG. 2A or 2B (solar cell dimension of 20 mm × 10 mm × 0.5 mm, and tin foil thickness of 40 microns) for measuring dose rates, and the circuit of FIG. 1. The output meter reading was found to be accurately proportional to the dose rate. The solid state ionization chamber of the emobiment proved to be capable of measuring the dose rate in a range of $10^2$ through $3 \times 10^6$ R/h.

FIG. 4 shows the result of measurement of the effect of the surface area of the compensating tin foil (40 micron thick) inserted between the solar cell surface and the probe wall on the relative difference between the response to the gamma-ray at an incident angle 0° and the similar response at an incident angle 180°, for the case of incident gamma-rays on a horizontal plane of the axis of the probe cylinder, as shown in the figure. The response to gamma-rays incoming at right angles to the aforesaid incident rays if generally intermediate between the aforesaid two responses, so that it was found that the directional dependence can be minimized by selecting a proper surface area of the tin foil (0.3 to 0.5 cm$^2$). The surface area of the tin foil can be easily determined for each probe, by using the gradient of the rectilinear portion of the graph. By using this method, uniform response which is substantially free from directional dependence can be achieved, e.g., a directional dependence of only ±1 to 2% over 360°, so that the directional dependence is drastically reduced, as compared with the conventional directional dependence of greater than 10%.

FIG. 5 shows the degradation of the sensitivity caused by Co-60 gamma-rays radiation, in the case of using P type bulk of 100 ohm-cm and 200 ohm-cm. The sensitivity degradation rate was found to be 0.25%/$10^6$ R (100 ohm-cm) and 0.1%/$10^6$ R (200 ohm-cm), and this value is less than one tenth of the conventional sensitivity degradation rate of solar cells on market, which is 2 to 20%/$10^6$ R. Thus, it is evident that the sensitivity of the ionization chamber of the present invention is stable even after a long period of service. When a high accuracy is required, one reference probe may be additionally provided, so as to carry out periodical checking of the sensitivity degradation by using it.

FIG. 6 illustrates the temperature dependence of the meter response. Although there is a slight dispersion for different specimens, a certain inceasing tendency with temperature rise was recongnized in a range of 0° to 50° C. The temperature coefficient is, however, 0.1 to 0.3%/ C, so that as long as the measurement at or in the proximity of the room temperature is concerned, the measuring error due to the temperature fluctuation is not very serious. To do an accurate temperature correction, it is sufficient to measure an identical dose rate at two different temperatures, once at each temperature for determining the temperature coefficient. It is also possible to make the correction by an electric circuit. The variation of the temperature coefficient due to radiation damage is negligible.

The conventional gaseous ionization chamber for measuring high dose rates is expensive and easily susceptible to radiation damage, so that it has not been possible to use such a gaseous ionization chamber as a routine dosimeter or a monitor. The solid state ionization chamber according to the present invention is inexpensive and simple, and yet it has a high radiation resistance, and in addition, its solar cell is easily replaceable for ensuring a long service life, whereby, it is freed from the aforesaid shortcmings of conventional ionization chambers. With the solid state ionization chamber of the present invention, the dose rate can be measured very quickly with a high reproducibility over a far wider range of dose than that of numerous integrating dosimeters. Furthermore, as a feature of the present invention, the simultaneous measurement of dose rates at many different locations is greatly facilitated by using a number of such probes.

We claim:

1. A solid state ionization chamber of silicon PN-junction type for detecting gamma-ray and X-ray radiations, comprising an N/P-type silicon solar cell, said N/P type solar cell being doped with copper for establishing a reduction rate of lifetime of minority carriers in response to gamma-ray and X-ray radiation to improve radiation resistance; and a heavy metal foil positioned adjacent said solar cell for compensating for directional dependence of said solar cell to incident direction of radiation.

2. An ionization chamber according to claim 1, wherein said heavy metal foil is of non-radioactive material.

3. An ionization chamber according to claim 1, wherein said heavy metal foil is a tin foil.

4. An ionization chamber according to claim 1, wherein said heavy metal foil is positioned adjacent a major surface of said solar cell.

5. An ionization chamber according to claim 4, wherein said heavy metal foil is of non-radioactive material.

6. An ionization chamber according to claim 4, wherein said heavy metal foil is a tin foil.

7. An ionization chamber according to claim 1, including a cap positioned about said solar cell for shielding against light.

8. An ionization chamber according to claim 7, wherein said cap is of cylindrical shape.

9. An ionization chamber according to claim 7, wherein said cap is of oblong shape.

10. An ionization chamber according to claim 1, including a probe body for supporting said solar cell, and a cap positioned about said solar cell for shielding said solar cell gainst light, said cap being carried by said probe body.

11. An ionization chamber according to claim 1, wherein said heavy metal foil is positioned adjacent a major surface of said solar cell and extends over less than the total area of said major surface.

* * * * *